United States Patent
Xu (10) Patent No.: US 11,621,261 B2
(45) Date of Patent: Apr. 4, 2023

(54) DETECTION CIRCUIT AND DETECTION METHOD

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 7 days.

(21) Appl. No.: 17/546,131

(22) Filed: Dec. 9, 2021

(65) Prior Publication Data

US 2023/0005907 A1  Jan. 5, 2023

Related U.S. Application Data

(63) Continuation of application No. PCT/CN2021/118704, filed on Sep. 16, 2021.

(30) Foreign Application Priority Data

Jul. 5, 2021 (CN) .................... 202110758286.X (51) Int. Cl.
*H01L 27/02* (2006.01)
*H05K 9/00* (2006.01)

(52) U.S. Cl.
CPC .......... *H01L 27/0255* (2013.01); *H01L 27/02* (2013.01); *H01L 27/0288* (2013.01); *H05K 9/0079* (2013.01)

(58) Field of Classification Search
CPC ........ H02H 3/20; H02H 9/04; H01L 27/0255; H01L 27/0248; H01L 21/67253;
(Continued)

(56) References Cited

U.S. PATENT DOCUMENTS 7,616,417 B2 * 11/2009 Yoshida ............. G01R 31/2879
361/111
10,170,461 B2   1/2019 Tseng
(Continued)

FOREIGN PATENT DOCUMENTS

CN   101740549 A   6/2010
CN   103185845 A   7/2013
(Continued)

OTHER PUBLICATIONS

"Study on Failure Mechanism of ESD Protection Devices under System-level Tests", Oct. 2016, Jin Liu and Yongguang Chen, Semiconductor Optoelectronics, vol. 37, No. 5, pp. 698-702.

*Primary Examiner* — Danny Nguyen
(74) *Attorney, Agent, or Firm* — Cooper Legal Group, LLC (57) ABSTRACT

The embodiments provide a detection circuit and a detection method. The detection circuit includes an ESD protection device, a first fuse and a transistor. A first terminal of the ESD protection device is connected to a first terminal of the first fuse, and a connection terminal of the ESD protection device and the first fuse serves as a first test terminal; a second terminal of the first fuse is connected to a gate electrode of the transistor, and a connection terminal of the first fuse and the transistor serves as a second test terminal; and a second terminal of the ESD protection device is connected to at least one of a source electrode, drain electrode or substrate of the transistor, and a connection terminal of the ESD protection device and the transistor serves as a third test terminal.

16 Claims, 3 Drawing Sheets

(58) Field of Classification Search
CPC .... G01R 31/26; G01R 1/067; G01R 1/06705; G01R 31/002
USPC .......................................................... 361/56
See application file for complete search history.

(56) References Cited

U.S. PATENT DOCUMENTS

| | | |
|---|---|---|
| 10,325,906 B2 | 6/2019 | Chang |
| 10,629,588 B2 | 4/2020 | Tseng |
| 10,756,082 B2 | 8/2020 | Chang |
| 10,957,687 B2 | 3/2021 | Tseng |
| 11,264,374 B2 | 3/2022 | Chang |
| 2017/0141100 A1 | 5/2017 | Tseng et al. |
| 2018/0088163 A1 | 3/2018 | Chang et al. |
| 2019/0067056 A1* | 2/2019 | Shen .................. G01R 3/00 |
| 2019/0109129 A1 | 4/2019 | Tseng et al. |
| 2019/0304967 A1 | 10/2019 | Chang et al. |
| 2020/0219868 A1 | 7/2020 | Tseng et al. |
| 2020/0381419 A1 | 12/2020 | Chang et al. |

FOREIGN PATENT DOCUMENTS

| | | |
|---|---|---|
| CN | 104020407 A | 9/2014 |
| CN | 103185845 B | 8/2015 |
| CN | 104851876 A | 8/2015 |
| CN | 106449601 A | 2/2017 |
| CN | 107017233 A | 8/2017 |
| JP | 2000133778 A | 5/2000 |

* cited by examiner

DETECTION CIRCUIT AND DETECTION METHOD

CROSS-REFERENCE TO RELATED APPLICATIONS

This application is a continuation of International Patent Application No. PCT/CN2021/118704, filed on Sep. 16, 2021 and claiming priority to Chinese Patent Application No. 202110758286.X, filed on Jul. 5, 2021. The disclosures of International Patent Application No. PCT/CN2021/118704 and Chinese Patent Application No. 202110758286.X are hereby incorporated by reference in their entireties.

TECHNICAL FIELD

Embodiments of the disclosure relate to, but are not limited to a detection circuit and a detection method.

BACKGROUND

ESD (Electrostatic discharge) refers to a burst current between two conductive objects caused by contact, electrical short circuit or dielectric breakdown. For example, in a process for manufacturing or using a chip, electrostatic charges generated by moving, rubbing or other actions may be accumulated in the chip. Once a pin of the chip comes into contact with the outside, the charges originally accumulated in the chip may be discharged outward from the chip, and ESD with a large current may be caused in a very short time.

With the increasing integration of integrated circuits (ICs), a gate dielectric layer of a transistor is getting thinner, and a thinner gate dielectric layer is more likely to be damaged due to ESD. Based on such a situation, ESD protection devices are generally arranged by IC manufacturers to avoid component damages caused by ESD.

SUMMARY

Embodiments of the disclosure provide a detection circuit, including an ESD protection device, a first fuse and a transistor. A first terminal of the ESD protection device is connected to a first terminal of the first fuse, and a connection terminal of the ESD protection device and the first fuse serves as a first test terminal; a second terminal of the first fuse is connected to a gate electrode of the transistor, and a connection terminal of the first fuse and the transistor serves as a second test terminal; and a second terminal of the ESD protection device is connected to at least one of a source electrode, a drain electrode or a substrate of the transistor, and a connection terminal of the ESD protection device and the transistor serves as a third test terminal.

Correspondingly, embodiments of the disclosure further provide a detection method, including: providing the detection circuit as described above, the detection circuit serving as a first detection circuit; blowing the first fuse of the first detection circuit, inputting a test current at the first test terminal and inputting a test current at the second test terminal, a magnitude and a duration of the test current being identical to a magnitude and a duration of a corresponding ESD current pulse; after the test currents are input to the first test terminal and the second test terminal, applying a detection voltage at the first test terminal and the third test terminal to detect a first drain current of the ESD protection device, and applying a detection voltage at the second test terminal and the third test terminal to detect a second drain current of the transistor; in response to determining the first drain current is smaller than a preset current value, determining that the ESD protection device has a self ESD protection capacity; and when the ESD protection device has the self ESD protection capacity, providing another detection circuit as described above, the another detection circuit serving as a second detection circuit; inputting a test current at the first test terminal of the second detection circuit; after the test current is input to the first test terminal of the second detection circuit, blowing the first fuse, and applying a detection voltage to the second test terminal and the third test terminal of the second detection circuit to detect a third drain current of the transistor; and in response to determining the third drain current is smaller than the second drain current, determining that the ESD protection device has an external ESD protection capacity.

BRIEF DESCRIPTION OF THE DRAWINGS

One or more embodiments are illustrated according to the figures in the corresponding drawings, which are not intended to limit the embodiments. Same reference numerals designate the same elements, and the figures in the drawings are not limited to the scale unless otherwise defined.

DETAILED DESCRIPTION

To make the objectives, technical schemes and advantages of the disclosure to be understood more clearly, embodiments of the disclosure will be further illustrated in detail below. However, those of ordinary skill in the art should understand that in the embodiments of the disclosure, numerous technical details will be provided to enable readers to better understand the disclosure. Even without the technical details and variations and modifications based on the following embodiments, the technical schemes claimed in the disclosure may be implemented.

When used herein, the singular forms "a(an)" and "said/the" may also include plural forms, unless the context clearly dictates otherwise. It should also be understood that when the terms "composition" and/or "including" are used in this specification, the existence of the described features, integers, processes, operations, elements and/or components can be determined, but the presence or addition of one or more other features, integers, processes, operations, elements, components and/or groups are not excluded. Meanwhile, when used herein, the term "and/or" includes any and all combinations of related listed items.

It should be understood that although the terms "first", "second", "third", and the like may be used to describe various elements, components, regions, layers, doping types, and/or portions, these elements, components, regions, layers, doping types, and/or portions should not be limited by these terms. These terms are used only to distinguish one element, component, region, layer, doping type or portion from another element, component, region, layer, doping type or portion.

Figure 1:
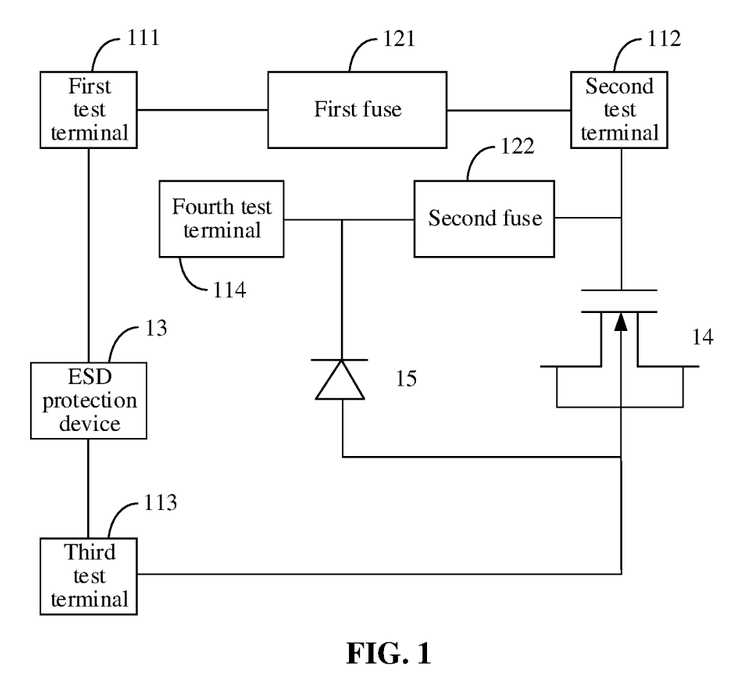
FIGS. 1 to 3 illustrate a detection circuit provided by embodiments of the disclosure.

With reference to FIG. 1, a detection circuit includes an ESD protection device 13, a first fuse 121, and a transistor 14. A first terminal of the ESD protection device 13 is connected to a first terminal of the first fuse 121, and a connection terminal of the ESD protection device 13 and the first fuse 121 serves as a first test terminal 111. A second terminal of the first fuse 121 is connected to a gate electrode of the transistor 14, and a connection terminal of the first fuse 121 and the transistor 14 serves as a second test terminal 112. A second terminal of the ESD protection device 13 is connected to at least one of a source electrode, a drain electrode or a substrate of the transistor 14, and a connection terminal of the ESD protection device 13 and the transistor 14 serves as a third test terminal 113.

When the first fuse 121 is blown, the ESD protection device 13 and the transistor 14 are relatively isolated, and a detection voltage applied to the first test terminal 111 and the third test terminal 113 can only measure a drain current of the ESD protection device 13, and a detection voltage applied to the second test terminal 112 and the third test terminal 113 can only measure a drain current of the transistor 14. In this way, interference caused by the ESD protection device 13 to the measurement of the drain current of the transistor 14 is avoided, and interference caused by the transistor 14 to the measurement of the drain current of the ESD protection device 13 is avoided, i.e., the measurement result of the drain current of the ESD protection device 13 and that of the transistor 14 are prevented from being substantially equal to the sum of the drain currents of the ESD protection device 13 and the transistor 14, thereby ensuring accurate measurement of the drain currents of the ESD protection device 13 and the transistor 14 before and after ESD.

The value of the detection voltage applied to the first test terminal 111 and the third test terminal 113 is equal to the voltage difference between the first test terminal 111 and the third test terminal 113. Similarly, the value of the detection voltage applied to the second test terminal 112 and the third test terminal 113 is equal to the voltage difference between the second test terminal 112 and the third test terminal 113. The values of the detection voltages for different objects to be tested may be different, the measurement of the drain current of the ESD protection device 13 and the measurement of the drain current of the transistor 14 may be performed simultaneously, and the third test terminal 113 may be grounded to avoid mutual interference between different measurements.

According to the embodiment, the detection circuit may further include a second fuse 122 and a diode 15. The second fuse 122 and the diode 15 are connected in series between the gate electrode of the transistor 14 and the third test terminal 113, the second fuse 122 and the diode 15 are connected in series, and a connection terminal of the second fuse 122 and the diode 15 serves as a fourth test terminal 114. As an example, the second fuse 122 may be connected in series between the diode 15 and the gate electrode of the transistor 14, the diode 15 may be connected in series between the second fuse 122 and the third test terminal 113, or the diode 15 may be connected in series between the second fuse 122 and the gate electrode of the transistor 14, and the second fuse 122 may be connected in series between the diode 15 and the third test terminal 113.

To prevent the arrangement of the diode 15 from interfering with the measurement of the drain current of the transistor 14, i.e. to avoid that the measurement result of the drain current of the transistor 14 is substantially equal to the sum of the drain current of the transistor 14 and the drain current of the diode 15, the second fuse 122 may be blown before the drain current of the transistor 14 is measured, so as to isolate the diode 15 and the transistor 14.

The diode 15 is configured to avoid overvoltage breakdown of the transistor 14. The transistor 14 may be provided with a parasitic diode, and the gate electrode of the transistor 14 may be subjected to overvoltage due to the accumulation of carriers. By controlling a breakdown voltage of the diode 15 to be smaller than a breakdown voltage of a gate dielectric layer of the transistor 14, the diode 15 may be subjected to reverse breakdown before the gate dielectric layer of the gate electrode of the transistor 14 is damaged due to overvoltage, and a large current can be discharged, thereby avoiding damages to the transistor 14.

Figure 2:
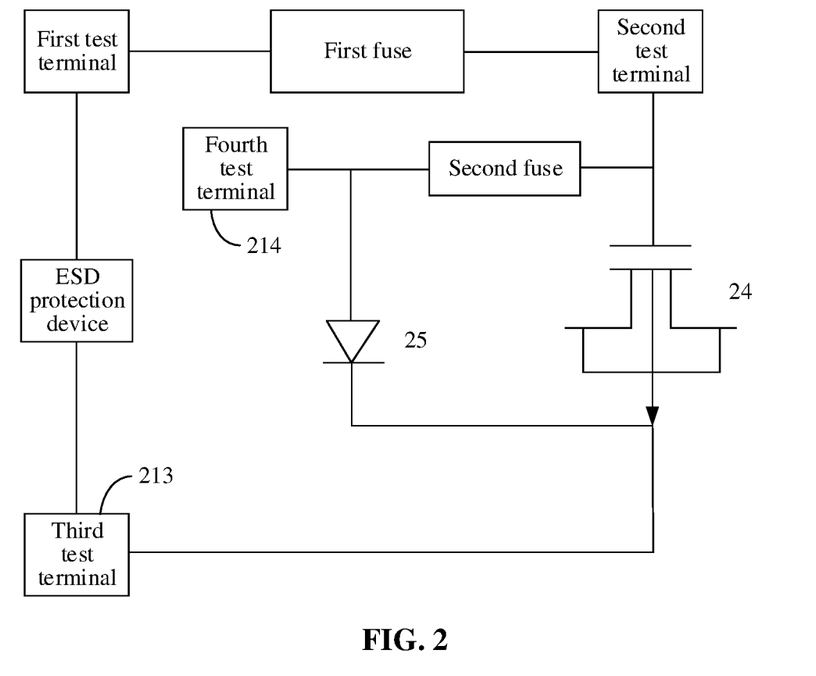

The direction of the diode 15 is related to the type of transistor 14. When the transistor 14 is an N-Metal-Oxide-Semiconductor (NMOS) transistor, a positive electrode of the diode 15 is connected to the third test terminal 113, and a negative electrode of the diode 15 is connected to the fourth test terminal 114. With reference to FIG. 2, when a transistor 24 is a P-Metal-Oxide-Semiconductor (PMOS) transistor, a positive electrode of a diode 25 is connected to a fourth test terminal 214 and a negative electrode of the diode 25 is connected to a third test terminal 213.

Figure 3:
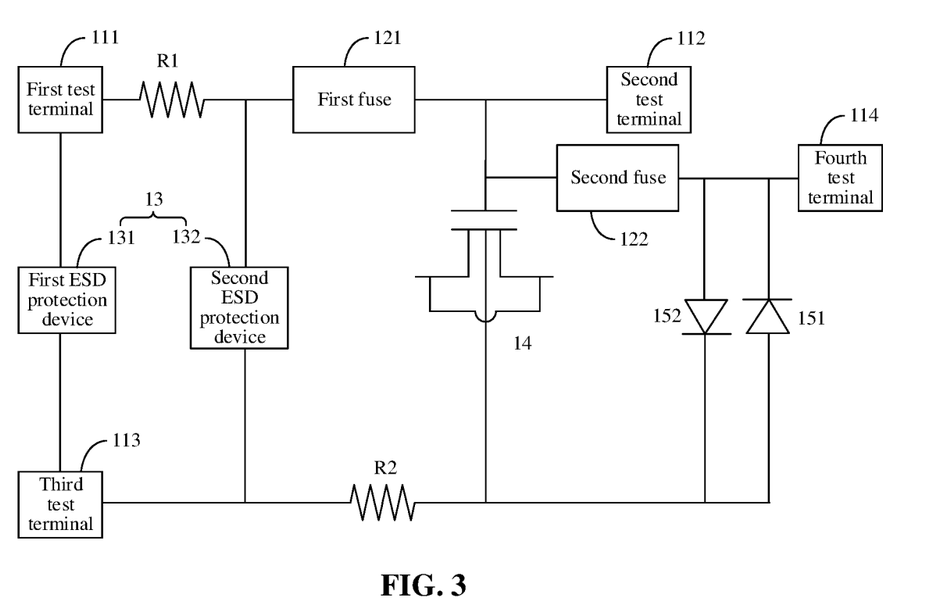

It should be noted that, according to some embodiments, with reference to FIG. 3, multiple diodes 15 may be arranged, including a first diode 151 and a second diode 152 in parallel. A positive electrode of the first diode 151 is connected to the third test terminal 113 and a negative electrode of the first diode 151 is connected to the fourth test terminal 114, a negative electrode of the second diode 152 is connected to the third test terminal 113 and a positive electrode of the second diode is connected to the fourth test terminal 114.

With further reference to FIG. 3, multiple ESD protection devices 13 may be arranged, including a first ESD protection device 131 and a second ESD protection device 132 in parallel. The detection circuit may further include a first resistor R1 and a second resistor R2. A first terminal of the first ESD protection device 131 is connected to the first test terminal 111, a second terminal of the first ESD protection device 131 is connected to the third test terminal 113, a first terminal of the first resistor R1 is connected to the first test terminal 111, and a second terminal of the first resistor R1 is connected to the first terminal of the first fuse 121 and a first terminal of the second ESD protection device 132 respectively; and the first terminal of the second ESD protection device 132 is connected to the second terminal of the first resistor R1 and the first terminal of the first fuse 121 respectively, a second terminal of the second ESD protection device 132 is connected to the third test terminal 113, a first terminal of the second resistor R2 is connected to the transistor 14, and a second terminal of the second resistor R2 is connected to the second terminal of the second ESD protection device 132 and the third test terminal 113 respectively. According to the detection circuit, both the first ESD protection device 131 and the second ESD protection device 132 can protect the transistor 14, and the protection of multiple ESD protection devices 13 in parallel for the transistor 14 can be measured by the detection circuit.

According to the embodiment, the ESD protection device 13 may include a diode, a transistor or a thyristor. The second terminal of the ESD protection device 13 may be connected to the source electrode, drain electrode and substrate of the transistor 14. Particularly, the ESD protection device 13 may be connected to the source electrode, drain electrode and substrate of the transistor 14 through the third test terminal 113. According to other embodiments, the ESD protection device 13 may be connected to the source electrode and drain electrode of the transistor 14, or the ESD protection device 13 may be connected to the substrate of the transistor 14.

According to the embodiment, the first fuse connected in series between the ESD protection devices in parallel and the transistor may be arranged. the ESD protection device can be isolated from the transistor by controlling the first fuse to be blown, so as to prevent the ESD protection device and the transistor from interfering with measurement of a drain current of each other, i.e., avoiding the measurement result of the drain current of the ESD protection device 13 from being substantially equal to the sum of the drain currents of the ESD protection device 13 and the transistor 14. Therefore accurate measurement of the drain currents of the ESD protection device 13 and the transistor 14 before and after the ESD is ensured, and then whether the ESD protection device has a self ESD protection capacity and the level of the self ESD protection capacity of the ESD protection device can be accurately determined. Furthermore, the self ESD protection capacity of the ESD protection device can be verified, so as to accurately determine whether the ESD protection device can protect the transistor, thus ensuring the accuracy of the test result.

Accordingly, an embodiment of the disclosure further provides a detection method, which may be implemented by adopting the detection circuit described above. The detection method includes the following operations.

Operation 1 includes that: the detection circuit shown in FIG. 1 is provided, which is referred as a first detection circuit; and the first fuse 121 of the first detection circuit is blown, and a test current is input at the first test terminal 111 and the test current is input at the second test terminal 112. A magnitude and a duration of the test current is identical to a magnitude and a duration of a corresponding ESD current pulse.

It should be noted that the detection circuit shown in FIG. 1 merely illustrates a structure of the detection circuit provided by the disclosure, and the detection method provided by the embodiments of the disclosure may be implemented with other structures derived from the illustrated structure. In addition, there are multiple modes of test currents corresponding to ESD current pulses, such as a component charge mode, a human body discharge mode, and a mechanical discharge mode. The component charge mode may include a chip-level component charge mode and a circuit board-level charge mode. When the detection method is implemented, an ESD current with the largest instantaneous current may be selected as a test current, and an ESD current with the longest duration may also be selected as a test current. An ESD current of a corresponding mode may also be selected according to an actual application scene. Or, the detection method may be implemented by use of each type of ESD current one by one.

According to the embodiment, the test currents may be input to the first test terminal 111 and the second test terminal 112 respectively, or the test currents may be input to the first test terminal 111 and the second test terminal 112 simultaneously. When the test currents are input simultaneously, the third test terminal 113 may be grounded to ensure the test independence of the ESD protection device 13 from the transistor 14.

The test current input to the first test terminal 111 is referred as a first test current, the test current input to the second test terminal 112 is referred as a second test current. When the foregoing detection method is implemented, only the modes of the ESD current pulses corresponding to the first test current and the second test current are required to be identical, and the parameters of the first test current and the second test current are not required to be identical. In an actual circuit, when the first fuse 121 remains connected, as a connection relationship between the ESD protection device 13 and the transistor 14 varies, the ESD current input to the first test terminal 111 does not necessarily have same current component on the branches on which the transistor 14 and the ESD protection device 13 are positioned respectively. When the foregoing detection method is implemented, the value of the first test current and the value of the second test current may be set according to the connection relationship between the ESD protection device 13 and the transistor 14, so that the corresponding current parameters approximate those in the actual situation.

Operation 2 includes: after the test currents are input to the first test terminal 111 and the second test terminal 112, a detection voltage is applied to the first test terminal 111 and the third test terminal 113 to detect a first drain current of the ESD protection device 13, and a detection voltage is applied to the second test terminal 112 and the third test terminal 113 to detect a second drain current of the transistor 14; and in response to determining the first drain current is smaller than a preset current value, it is determined that the ESD protection device 13 has a self ESD protection capacity.

The first drain current is configured to represent the electrical property of the ESD protection device 13 after being subjected to ESD. When the first drain current is larger than or equal to the preset current value, it is indicated that the ESD protection device 13 is short-circuited due to breakdown or damage. Then, the first test terminal 111 and the third test terminal 113 are short-circuited, and the transistor 14 may be shielded by the short circuit of the first test terminal 111 and the third test terminal 113, therefore the transistor 14 cannot play the original function thereof. When the first drain current is smaller than the preset current value, it is indicated that the ESD protection device 13 can effectively discharge the ESD current, and the characteristics thereof remain unchanged or slightly changed after being subjected to the ESD, without affecting the function of the transistor 14. That is, the ESD protection device 13 having the self ESD protection capacity can withstand at least one ESD current, so as to protect the transistor 14 without interfering with the normal operation of the transistor 14.

It should be noted that, only after the ESD protection capacity of the ESD protection device 13 is verified, it is meaningful to consider the protection of the ESD protection device 13 for the transistor 14. Otherwise, when the transistor 14 is shielded due to the short circuit of the ESD protection device 13, the transistor 14 cannot play the function thereof, the protection of the ESD protection device 13 for the transistor 14 is meaningless. In addition, during the manufacturing, transportation and use of a semiconductor device, ESD may occur more than once, and then the ESD protection device 13 is required to be able to be reused.

Operation 3 includes: when the ESD protection device 13 has the self ESD protection capacity, another detection circuit described above is provided, which is referred as a second detection circuit; and a test current is input to the first test terminal 111 of the second detection circuit.

Under the precondition that the ESD protection device 13 protects the transistor 14, the ESD protection device 13 is effectively connected in parallel to the transistor 14. The first fuse 121 has been blown in the process for measuring the drain currents of the ESD protection device 13 and the transistor 14 respectively, therefore another detection circuit in which another first fuse 121 is connected is required to be provided to measure the protection of an ESD protection device 13 on a transistor 14. According to other embodiments, the first fuse 121 which has been blown may further be reconnected, without providing another detection circuit.

The test current input to the first test terminal 111 of the second detection circuit may be referred as a third test current. When the protection of the ESD protection device 13 on the transistor 14 is measured, the mode of the third test current is identical to that of a corresponding ESD current, and the value of the third test current is equal to that of the ESD current.

Operation 4 includes: after the third test current is input to the first test terminal of the second detection circuit, the first fuse 121 is blown, and a detection voltage is applied to a second test terminal 112 and a third test terminal 113 to detect a third drain current of the transistor 14; and in response to determining the third drain current is smaller than the second drain current, it is determined that the ESD protection device 13 has an external ESD protection capacity.

The external ESD protection capacity represents the capacity of the ESD protection device 13 to protect the transistor 14. In the process for inputting the third test current, when the ESD protection device 13 has the function of protecting the transistor 14, the damage degree of the transistor 14 should be reduced, and the third drain current should be smaller than the second drain current; and when the ESD protection device 13 does not have the function of protecting the transistor 14, the transistor 14 is correspondingly subjected to the test current alone, and the third drain current then should be equal to or even larger than the second drain current.

According to the embodiment, after the first fuse 121 of the first detection circuit is blown and before the second test current is input to the second test terminal 112, a detection voltage may be applied to the second test terminal 112 and the third test terminal 113 to detect an initial drain current of the transistor; and after the third drain current is obtained, the external ESD protection capacity of the ESD protection device 13 may be represented based on the parameters of the third drain current, the second drain current and the initial drain current.

It should be noted that, the fact that the ESD protection device 13 has the external ESD protection capacity does not mean that the external ESD protection capacity of the ESD protection device 13 is qualified. According to some embodiments, the transistor 14 has an allowable error range centered on an initial drain current, the allowable error range is independence of a second drain current, and an external ESD protection capacity of the ESD protection device 13 is considered to be qualified only if a third drain current is within the allowable error range.

According to the embodiment, the operation of blowing the first fuse 121 may includes that a blowing voltage is applied to the first test terminal 111 and the second test terminal 112, the blowing voltage being larger than a nominal voltage of the first fuse 121. The blowing voltage is equal to the difference between different voltages applied to the first test terminal 111 and the second test terminal 112. In order to avoid damages to the transistor 14 caused by the blowing voltage, the first test terminal 111 may be set to be at the high level and the second test terminal 112 may be grounded.

According to the embodiment, the detection circuit may further include a second fuse 122 and a diode 15. The second fuse is connected in series between the diode 15 and the gate electrode of the transistor 14, and the diode 15 is connected in series between the second fuse 122 and the third test terminal 113. Before the test current is input to the second test terminal 112 of the first detection circuit, the second fuse 122 of the first detection circuit is blown, so that current discharge of the diode is avoided, thereby accurately measuring the second drain current of the transistor 14 under the impact of the ESD, and then accurately determining the external ESD protection capacity of the ESD protection device 13 based on the second drain current. Then, before the test current is input to the first test terminal of the second detection circuit, a second fuse 122 of the second detection circuit is blown, thereby avoiding that the measured external ESD protection capacity of the ESD protection device 13 is substantially equal to the protection capacity of the ESD protection device 13 and that of the diode 15 in total, and ensuring the accuracy of the representation of the external ESD protection capacity.

According to some embodiments, with reference to FIG. 3, multiple ESD protection devices 13 in parallel may be provided to protect the transistor 14, and an external ESD protection capacity of the ESD protection devices 13 is jointly determined by the multiple ESD protection devices 13.

According to the embodiments, a connection terminal of the second fuse 122 and the diode 15 serves as the fourth test terminal 114. The operation of blowing the second fuse 122 includes that: a blowing voltage is applied to the second test terminal 112 and the fourth test terminal 114, the blowing voltage being larger than a nominal voltage of the second fuse 122. According to other embodiments, the positions of the second fuse and the diode are interchanged, i.e. the diode is connected in series between a second fuse and a gate electrode of a transistor, and the second fuse is connected in series between the diode and the third test terminal. Then, the operation of blowing the second fuse may include that: a blowing voltage is applied to the third test terminal and the fourth test terminal. It should be noted that the nominal voltages of different fuses may be different, and accordingly, the blowing voltages applied for blowing the fuses may be different.

According to the embodiments, before an initial drain current of the transistor 14 is detected, the second fuse 122 may be blown. Therefore, the measurement result of the initial drain current of the transistor 14 can be prevented from being substantially the sum of the initial drain current of the transistor 14 and an initial drain current of the diode 15, thereby ensuring the accuracy of an external ESD protection capacity determined based on the initial drain current.

According to the embodiments, the first fuse connected in series between the ESD protection devices in parallel and the transistor may be arranged, and the ESD protection devices can be isolated from the transistor by controlling the first fuse to be blown. Therefore, interference caused by the ESD protection device 13 to the measurement of the drain current of the transistor 14 is avoided, and interference caused by the transistor 14 to the measurement of the drain current of the ESD protection device 13 is avoided, i.e., the measurement result of the drain current of the ESD protection device 13 is prevented from being substantially the sum of the drain currents of the ESD protection device 13 and the transistor 14, thereby ensuring accurate measurement of the drain current of the ESD protection device 13 before and after ESD. Further, whether the ESD protection device has a self ESD protection capacity can be accurately determined and the level of the self ESD protection capacity of the ESD protection device can be accurately determined. Furthermore, the self ESD protection capacity of the ESD protection device is verified, so as to accurately determine whether the ESD protection device can protect the transistor, thus ensuring the accuracy of the test result.

Those of ordinary skill in the art should understand that the foregoing implementations are specific embodiments for implementing the disclosure and in practical application, variations may be made in terms of the form and detail thereof without departing from the spirit of and scope of the disclosure. Any person skilled in the art may make variations and modifications without departing from the spirit and scope of the disclosure, therefore the scope of the disclosure should be defined by the claims.

The invention claimed is:

1. A detection circuit, comprising: an Electrostatic discharge (ESD) protection device, a first fuse and a transistor, wherein,
   a first terminal of the ESD protection device is connected to a first terminal of the first fuse, and a connection terminal of the ESD protection device and the first fuse serves as a first test terminal;
   a second terminal of the first fuse is connected to a gate electrode of the transistor, and a connection terminal of the first fuse and the transistor serves as a second test terminal; and
   a second terminal of the ESD protection device is connected to at least one of a source electrode, a drain electrode or a substrate of the transistor, and a connection terminal of the ESD protection device and the transistor serves as a third test terminal.

2. The detection circuit of claim 1, further comprising: a second fuse and a diode,
   wherein the second fuse is connected in series between the diode and the gate electrode of the transistor, and the diode is connected in series between the second fuse and the third test terminal, and a connection terminal of the second fuse and the diode serves as a fourth test terminal.

3. The detection circuit of claim 2, wherein the transistor is an N-Metal-Oxide-Semiconductor (NMOS) transistor, a positive electrode of the diode is connected to the third test terminal, and a negative electrode of the diode is connected to the fourth test terminal.

4. The detection circuit of claim 2, wherein the transistor is a P-Metal-Oxide-Semiconductor (PMOS) transistor, a positive electrode of the diode is connected to the fourth test terminal, and a negative electrode of the diode is connected to the third test terminal.

5. The detection circuit of claim 2, wherein the diode comprises a first diode and a second diode in parallel, a positive electrode of the first diode is connected to the third test terminal, a negative electrode of the first diode is connected to the fourth test terminal, a negative electrode of the second diode is connected to the third test terminal, and a positive electrode of the second diode is connected to the fourth test terminal.

6. The detection circuit of claim 1, wherein the ESD protection device comprises a first ESD protection device and a second ESD protection device in parallel, and the detection circuit further comprises a first resistor and a second resistor;
   a first terminal of the first ESD protection device is connected to the first test terminal, a second terminal of the first ESD protection device is connected to the third test terminal, a first terminal of the first resistor is connected to the first test terminal, and a second terminal of the first resistor is connected to the first terminal of the first fuse and a first terminal of the second ESD protection device respectively; and
   the first terminal of the second ESD protection device is connected to the second terminal of the first resistor and the first terminal of the first fuse respectively, a second terminal of the second ESD protection device is connected to the third test terminal, a first terminal of the second resistor is connected to the transistor, and a second terminal of the second resistor is connected to the second terminal of the second ESD protection device and the third test terminal respectively.

7. The detection circuit of claim 1, wherein the ESD protection device comprises a diode, a transistor or a thyristor.

8. The detection circuit of claim 1, wherein the second terminal of the ESD protection device is connected to the source electrode and the drain electrode of the transistor.

9. The detection circuit of claim 1, wherein the second terminal of the ESD protection device is connected to the substrate of the transistor.

10. The detection circuit of claim 1, wherein the second terminal of the ESD protection device is connected to the source electrode, the drain electrode and the substrate of the transistor.

11. A detection method, comprising the operations:
    providing the detection circuit of claim 1, the detecting circuit serving as a first detection circuit;
    blowing the first fuse of the first detection circuit, inputting a test current at the first test terminal and inputting a test current at the second test terminal, wherein a magnitude and a duration of the each test current are identical to a magnitude and a duration of a corresponding Electrostatic discharge (ESD) current pulse;
    after the test currents are input to the first test terminal and the second test terminal, applying a detection voltage at the first test terminal and the third test terminal to detect a first drain current of the ESD protection device, and applying the detection voltage at the second test terminal and the third test terminal to detect a second drain current of the transistor; and in response to determining the first drain current is smaller than a preset current value, determining that the ESD protection device has a self ESD protection capacity;
    when the ESD protection device has the self ESD protection capacity, providing another detection circuit of claim 1, the another detection circuit serving as a second detection circuit;
    inputting a test current at the first test terminal of the second detection circuit; and
    after the test current is input to the first test terminal of the second detection circuit, blowing the first fuse, and applying a detection voltage to the second test terminal and the third test terminal of the second detection circuit to detect a third drain current of the transistor; and in response to determining the third drain current is smaller than the second drain current, determining that the ESD protection device has an external ESD protection capacity.

12. The detection method of claim 11, wherein
    after the first fuse of the first detection circuit is blown and before the test current is input to the second test terminal, a detection voltage is applied to the second test terminal and the third test terminal to detect an initial drain current of the transistor; and
    after the third drain current is obtained, the external ESD protection capacity of the ESD protection device is represented based on parameters of the third drain current, the second drain current and the initial drain current.

13. The detection method of claim 11, wherein blowing the first fuse comprises:

applying a blowing voltage to the first test terminal and the second test terminal, the blowing voltage being larger than a nominal voltage of the first fuse.

14. The detection method of claim 11, wherein the detection circuit further comprises a second fuse and a diode, the second fuse is connected in series between the diode and the gate electrode of the transistor, and the diode is connected in series between the second fuse and the third test terminal; and before the test current is input to the second test terminal of the first detection circuit, the second fuse of the first detection circuit is blown; and before the test current is input to the first test terminal of the second detection circuit, the second fuse of the second detection circuit is blown.

15. The detection method of claim 14, wherein a connection terminal of the second fuse and the diode serves as a fourth test terminal;
blowing the second fuse comprises: applying a blowing voltage to the second test terminal and the fourth test terminal, the blowing voltage being larger than a nominal voltage of the second fuse.

16. The detection method of claim 14, wherein before an initial drain current of the transistor is detected, the second fuse is blown.

\* \* \* \* \*